United States Patent [19]

Ozawa

[11] Patent Number: 6,124,064
[45] Date of Patent: Sep. 26, 2000

[54] LIGHT EXPOSURE CONTROLLING METHOD

[75] Inventor: Ken Ozawa, Kawaguchi, Japan

[73] Assignee: Nikon Corporation, Tokyo, Japan

[21] Appl. No.: 09/023,202

[22] Filed: Feb. 13, 1998

[30] Foreign Application Priority Data

Feb. 14, 1997 [JP] Japan .................................. 8-030645

[51] Int. Cl.[7] .................................................. G03F 9/00
[52] U.S. Cl. ........................................... 430/30; 430/296
[58] Field of Search ...................................... 430/30, 296

[56] References Cited

U.S. PATENT DOCUMENTS

| | | | |
|---|---|---|---|
| 5,466,549 | 11/1995 | Yamada | 430/30 |
| 5,473,412 | 12/1995 | Ozawa | 355/77 |
| 5,534,970 | 7/1996 | Nakashima et al. | 355/53 |
| 5,574,537 | 11/1996 | Ozawa | 355/71 |
| 5,659,383 | 8/1997 | Ozawa | 355/53 |
| 5,736,281 | 4/1998 | Watson | 430/30 |

*Primary Examiner*—Christopher G. Young
*Attorney, Agent, or Firm*—Foley & Lardner

[57] ABSTRACT

Projection for evaluation is carried out prior to actual projection according to a predetermined projection sequence without performing shot-by-shot light exposure control to measure average pulse energy $p(i)$ through an integrator sensor every shot area. Then set pulse energy $S_0/N$ is divided by the average pulse energy $p(i)$, thereby calculating correction coefficients $t(i)$ ($=S_0/p(i)\cdot N$)) of pulse energy for the i-th shot areas and thus producing a correction data map upon actual projection on the i-th shot area, an adjustment amount obtained by multiplying an adjustment amount before correction by the correction coefficient $t(i)$ is used as an adjustment amount in an energy fine adjuster.

25 Claims, 4 Drawing Sheets

LIGHT EXPOSURE CONTROLLING METHOD

BACKGROUND OF THE INVENTION

1. Field of the Invention

The present invention relates to a light exposure controlling method for controlling a light exposure for projecting predetermined pattern to a photosensitive substrate, for example, in exposure apparatus used in the photolithography process for producing semiconductor devices, solid state image sensing devices, liquid-crystal display devices, thin-film magnetic heads, or the like, which can be applied to a full wafer exposure apparatus, but which is suitably applicable particularly to scanning projection exposure apparatus of the step-and-scan method or the like.

2. Related Background Art

For producing the semiconductor devices etc., the projection exposure apparatus has been used heretofore for projecting a pattern of a mask on a reticle through a projection optical system to each shot area on a wafer (or a glass plate or the like) coated with a photoresist. One of fundamental functions in such projection exposure apparatus is a light exposure controlling function for keeping the light exposure (total light energy incident on the surface per unit area) at each point in each shot area of the wafer within an appropriate range.

The light exposure control in the full wafer projection exposure apparatus such as the conventional steppers was basically the cut-off control in either case where the illumination light source was a continuous light source such as an ultra-high-pressure mercury lamp or a pulsed laser light source such as an excimer laser light source. This cut-off control is such a control that during light irradiation to a photosensitive material coated on the wafer, part of the light is branched away to be guided to an integrator sensor comprised of a photoelectric sensor, the light exposure on the wafer is indirectly detected through this integrator sensor, and emission of light is carried on before an integrated value of this detection result exceeds a predetermined level (critical level) corresponding to a light exposure necessary for the photosensitive material (hereinafter referred to as "set light exposure"). (In the case of the continuous light, the shutter is closed when the integrated value exceeds the critical level.)

When the pulsed laser light source is used as an illumination light source, there are variations in energy among pulsed laser beams. Therefore, desired repeatability of control accuracy of light exposure is achieved by irradiation with a certain fixed number (hereinafter referred to as "minimum exposure pulse number") or more of laser beam pulses. In this case, for example, when a high-sensitivity photoresist is exposed to light, the set light exposure is small; if the laser light pulse is used just as it is, the light exposure even in the minimum exposure pulse number will exceed the set light exposure, which will become an overexposure. In such cases of small set light exposure, the pulsed laser light was attenuated, for example, by a light attenuating mechanism set in the optical path, whereby appropriate exposure level was able to be made by pulses in the number equal to or higher than the minimum exposure pulse number.

In recent years, in order to transfer a larger-area pattern onto the wafer at high accuracy without increasing the scale of the projection optical system, the projection exposure apparatus using the step-and-scan method was also developed in the arrangement for successively transferring the pattern of reticle to each shot area on the wafer by synchronously scanning the reticle and wafer relative to the projection optical system in such a state that a part of the pattern of reticle is projected through the projection optical system onto the wafer. In this scanning type projection exposure apparatus, the light exposure control with focusing attention on only a point on the wafer is not adaptable, so that the aforementioned cut-off control cannot be applied. Then a first control method was a method for controlling the light exposure by simply integrating the quantity of each pulsed illumination beam (an open light exposure control method). A second control method adopted was a method for controlling the energy of each pulsed illumination beam by measuring in real time the integrated light exposure for a region included in a slit illumination field (exposure area) in the scan direction on the wafer every pulsed illumination beam and individually calculating a target energy of the next pulsed illumination beam, based on the integrated light exposure (a pulse-by-pulse light exposure control method).

In the first control method of the former, the pulse energy needs to be finely adjusted so that the following relation holds, i.e., so that the exposure pulse number is an integer, in order to achieve desired linearity of light exposure control.

$$\text{(set light exposure)} = \text{(pulse number)} \times \text{(average energy of one pulse)} \times \text{(adjusted rate of pulse energy (modulation rate))} \quad (1)$$

In this equation the average energy of one pulse is a value indirectly measured by use of the aforementioned integrator sensor immediately before exposure. The output of the integrator sensor is calibrated with respect to a reference illuminance meter set on the image plane. In the second control method of the latter, the pulse energy needs to be finely adjusted every emission of pulsed beam. Therefore, either method requires an energy fine adjuster in the optical path of pulsed beam.

Each of FIGS. 7A and 7B illustrates a conventional energy fine adjuster. Among them, the fine adjuster of a double grating method shown in FIG. 7A is arranged in such a configuration that a fixed grating plate 52, in which transmitting portions and interrupting portions are alternately formed each at predetermined pitch, and a movable grating plate 51, which is movable in the pitch direction of grating, are superimposed on the optical path of laser beam LB emitted in the pulsed form and that the transmittance for the laser beam LB can be finely adjusted by shifting the two grating plates 51, 52 relative to each other The fine adjuster of FIG. 7B is arranged in such a configuration that two glass plates 53, 54, the both surfaces of each of which are coated with an antireflection coating, are placed in symmetry and both in an inclined state at a variable inclination angle θ with respect to the symmetry axis, on the optical path of the laser beam LB. The overall transmittance with respect to the optic axis of the laser beam LB is finely adjusted by controlling the inclination angle θ, utilizing such a property that the transmittance of the glass plates 53, 54 varies depending upon the angle of incidence of beam. A further device for modulating the output power of the laser light source itself was also proposed as another example of the fine adjuster of pulse energy.

Further, a third control method is a method for controlling the light exposure every shot area by changing setting of the energy fine adjuster or the scanning speed of the stage, based on the light exposure measured in a shot area immediately before one of interest (a shot-by-shot light exposure control method). Since the cut-off control as in the full wafer projection exposure apparatus cannot be applied to the scanning projection exposure apparatus, the light exposure control is normally an open loop control, and all of the first to third control methods described above are techniques necessary for the open loop light exposure control.

In the earlier technology as described above, when the excimer laser light source is used as an illumination light source, the device of the excimer laser light source is larger than that of the high-pressure mercury lamp, which is one of typical illumination light sources theretofore, and the excimer laser light source necessitates gas pipe facilities or the like; therefore, in general, the excimer laser light source is set as separated from the main body of exposure apparatus and the laser beam from the laser light source is supplied to the main body of exposure apparatus while being routed through a beam sending optical system. This means that a vibration control system of the main body of exposure apparatus is separated from that of the laser light source If during successive irradiation in respective shot areas on one wafer the wafer stage moves according to positions of the shot areas, so as to cause inclination in the posture, or deformation of the main body of exposure apparatus, deviation will occur in the relative position and angle between the laser light source and the main body of exposure apparatus, thereby causing a so-called optic axis offset. The effect of this optic axis offset is not great enough to affect the performance of the imaging system of the exposure apparatus, but it could cause several %-change in an uptake amount of the laser beam into a fly's eye lens for uniforming the illuminance distribution, with movement of the irradiated position during irradiation on one wafer. Namely, the direction and amount of the optic axis offset correlate with the irradiated position on the wafer. A varying amount of the light exposure within the wafer is determined by the amount of optic axis offset, and asymmetry and an initial adjustment state of intensity distribution of the laser beam.

FIGS. 8A and 8B are explanatory drawings of the optic axis offset. In FIG. 8A, the main body of exposure apparatus is installed in body frame 55. For convenience of description, the figures show only wafer stage 56 out of the components in the main body of exposure apparatus, and fly's eye lens 57 in an illumination system in the main body of exposure apparatus, in the body frame 55. The laser beam LB emitted from excimer laser light source 58 set outside the body frame 55 is guided through the beam sending optical system including mirror 59 etc. to illuminate illumination area 60 of the entrance plane of the fly's eye lens 57 in the body frame 55. In the state shown in FIGS. 8A, the wafer stage 56 is located in the center of the body frame 55 and no optic axis offset appears. Thus, the entrance plane of the fly's eye lens 57 is within the illumination area 60 of the laser beam LB.

In contrast with it, for example, in the case wherein a position of a shot area to be exposed on the wafer is very far from the shot area exposed immediately before it, when the position of the wafer stage (precisely, a moving part thereof) 56 largely moves within the body frame 55 as shown in FIG. 8B, the body frame 55 can slightly deform (or be distorted) or be inclined by change in the mechanical center of gravity or the like. When the body frame 55 deforms in this way, deviation (the optic axis offset) occurs between the optic axis of the illumination system and the optic axis of the external excimer laser light source 58, so that the entrance plane of the fly's eye lens 57 may be off the illumination area 60 of the laser beam LB. Then, the light exposing the shot area of interest decreases in the open loop light exposure control described in the conventional example. If the position of the wafer stage 56 varies depending upon the position of the shot area to be exposed on the wafer as described above, the short-term optic axis offset will appear therewith, causing variation in the light exposure.

Further, for example, in the case wherein the laser light source is located on a floor different from that where the main body of exposure apparatus is placed, middle-term and long-term optic axis offsets will also appear due to secular change. The variation in the uptake amount into the fly's eye lens will take place in the composite form of the short-term, middle-term, and long-term optic axis offsets described above. In the case of the open loop light exposure control, such variation in the uptake light amount will result in variations in an average light exposure given to each shot area.

Even with such variation in the light exposure and, for example, when the positions of shot areas to be exposed almost continuously change on the wafer, the necessary light exposure control accuracy can be achieved by applying the third light exposure control method (the shot-by-shot light exposure control method) described previously to finely modulate the pulse energy, based on a measured-value of light exposure in the shot area immediately before. However, in the case wherein locations of plural shot areas to be exposed are discrete on one wafer and they are greatly distant from each other, for example as in the case of production of application specific IC (ASIC), variation in the average light exposure will appear due to a small optic axis offset when the wafer stage is largely moved in order to move the next shot area to the illumination field from the shot area exposed immediately before it; and there is the possibility that the correction technique on the basis of the information in the shot area immediately before could fail to accurately correct the light exposure.

In the case of successive irradiation on wafers in one lot, one wafer is changed to another and shot area exposure is normally started from the same position in the next wafer. On this occasion, even assuming that a light exposure in the first shot area of the next exposed wafer is corrected based on the exposure result in the final shot area of the previously exposed wafer by the third light exposure control method described above, there will arise a problem that the variation in the average light exposure due to the optic axis offset is not corrected well, because the irradiated position of the first shot area is greatly different from that of the final shot area in the wafer.

Further, in the case wherein the wafer stage is stepped at high speed and, for example, on the occasion of change in the column or the row of the shot area to be exposed, the optic axis offset will appear prominent, because the posture of the main body of exposure apparatus greatly changes instantly because of reaction force. The variation in the light exposure will be also large at this time, and there will arise a problem that such variation in the light exposure cannot be corrected by the shot-by-shot light exposure control method.

The variation in the light exposure described above is one caused by the optic axis offset due to the change in the posture of the main body of exposure apparatus during the exposure operation and, in addition to it, it is known that the average output of the excimer laser light source itself also varies during the exposure and also varies with a lapse of time. Accordingly, in order to perform the light exposure control at higher accuracy, the control needs to be carried out while discriminating the output variation of the illumination light source itself from the variation of actual irradiation energy on the wafer due to the other factors than the output variation.

SUMMARY OF THE INVENTION

In view of the above points, a first object of the a present invention is to provide a light exposure controlling method that can control light exposures for shot areas each at high accuracy. A second object of the present invention is to provide a light exposure controlling method that can control light exposures for shot areas each in an appropriate range even if the illuminance (exposure energy) of illumination light to the sensitive substrate varies depending upon positions (exposure positions) of the shot areas of exposure objects on the sensitive substrate.

A third object of the present invention is to provide a light exposure controlling method that can control a light exposure for each shot area on the photosensitive substrate at high accuracy and in an appropriate range even if there is the output variation of the illumination light source, in addition to the variation in the illuminance of illumination light depending upon the position to be exposed.

A light exposure controlling method according to the present invention is a light exposure controlling method adapted for an exposure apparatus for illuminating a mask (11) with Illumination light emitted from an illumination light source (1) and successively projecting and transferring a pattern formed on this mask (11) to each of plural shot areas provided on a photosensitive substrate (14), said light exposure controlling method controlling a light exposure given by the illumination light for each of these shot areas, said light exposure controlling method comprising steps of preliminarily performing projecting on a substrate for evaluation by use of the exposure apparatus in accordance with a predetermined-reference projection sequence for the plural shot areas, measuring a light exposure at a position corresponding to each of the plural shot areas to obtain light exposure correction data for giving an appropriate light exposure for each of the plural shot areas, thereby producing a correction data map in correspondence to the shot areas, and correcting the light exposure in each shot area, using the correction data map, upon projecting the pattern on the photosensitive substrate in accordance with the predetermined projection sequence.

According to the present invention, projection step is preliminarily carried out actually at each position to be exposed by use of the evaluation substrate to measure the actual light exposure at each position, and, for example, ratios of these actual light exposures to an appropriate light exposure are stored in the form of the correction data map. When projection step is actually carried out thereafter on the photosensitive substrate, for example, modulation of illuminance of the illumination light or the like is performed so as to cancel a variation of light exposure anticipated from the correction data map in accordance with the exposure position. Even if the illuminance of illumination light changes because of occurrence of the optic axis offset from the illumination light source, caused by the change in the posture of the exposure apparatus or the like with the change in the position to be exposed, the above method can obtain the appropriate light exposure by canceling the change.

For example, when the first shot area of the second or later photosensitive substrate in one lot is exposed, the light exposure is not corrected based on the exposure result of the last shot on the photosensitive substrate immediately before, but the light exposure is corrected based on the correction data map, whereby the variation in the light exposure depending upon the exposure position can be corrected well.

In this case, if a plurality of photosensitive substrates is continuously exposed, the correction data map should desirably be updated based on the exposure result theretofore. This allows an accurate correction data map to be used even in such a case that the optic axis offset between the illumination light source and the illumination system gradually varies because of the secular change.

Another desired arrangement is such that, if several shot areas are successively exposed, when a shot area close to a shot area exposed immediately before it is exposed, the light exposure is corrected based on an actual light exposure in the shot area immediately before; when a shot area greatly distant from the shot area exposed immediately before it is exposed, the light exposure is corrected by use of the correction data map. In the case wherein the array of shots are discrete and the stepping amount of the stage is large as in the latter, the variation in the light exposure depending upon the position to be exposed can be corrected well by correcting the light exposure, based on the correction data map.

A further desired arrangement is such that the illuminance of the illumination light (emitted from the illumination light source (1)) is measured when the evaluation substrate or photosensitive substrate is exposed, a variation between an actual light exposure and a desired light exposure is resolved, based on the measured illuminance, into a first component due to the positional deviation of the optic axis of the illumination light, occurring according to the position of each of plural shot areas, and a second component due to the output variation of the illumination light source itself, and the light exposure for each of plural shot areas is corrected according to the correction data map based on the first component This can accurately extract only the variation in the light exposure depending upon the position to be exposed even with presence of the output change of the illumination light source (1) during production of the correction data map, which improves the light exposure control accuracy.

Further, when the first component exceeds a predetermined permissible amount, the optic axis of the illumination light should desirably be corrected. This can correct a large optical axis offset.

In the present invention as described above, an example of the exposure apparatus is a scanning projection type exposure apparatus for transferring patterns on each shot area of the photosensitive substrate by synchronously scanning the mask (11) and the photosensitive substrate (14) to be exposed relative to the illumination light. By applying the present:invention to the scanning type exposure apparatus, the light exposure control can be done in an open loop with high accuracy.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DESCRIPTION OF THE PREFERRED EMBODIMENTS

An embodiment of the light exposure controlling method according to the present invention will be described referring to FIG. 1 to FIG. 6. This embodiment is an embodiment which the present invention is applied to the case wherein the light exposure control is carried out in a projection exposure apparatus of the step-and-scan method using an excimer laser light source, being a pulsed light source, as an illumination light source.

Figure 1:
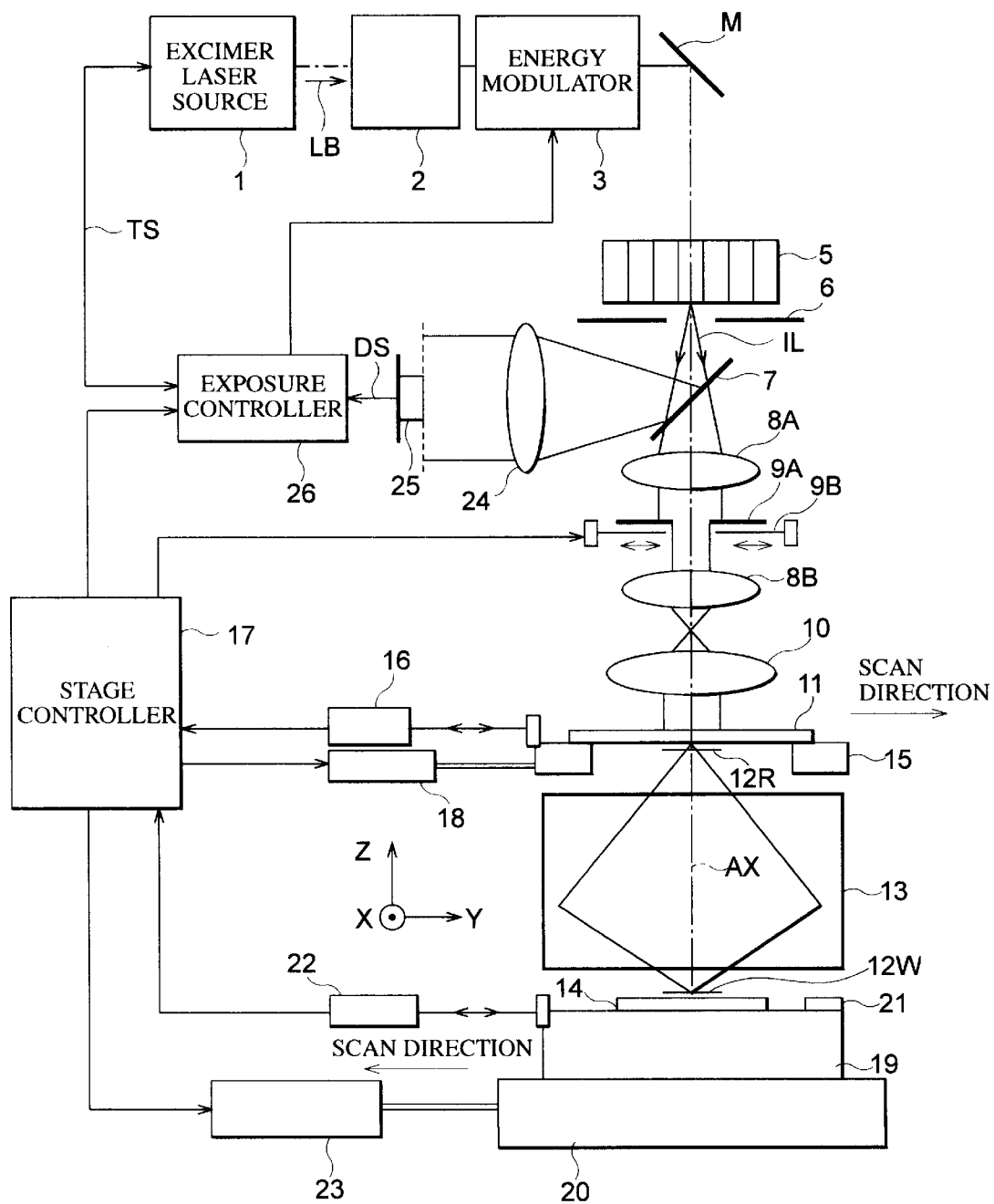
FIG. 1 is a structural drawing to show a projection exposure apparatus of the step-and-scan method used in an embodiment of the present invention.

FIG. 1 shows the projection exposure apparatus of this embodiment. In this FIG. 1, the laser beam LB emitted in the pulse form from the excimer laser light source 1 is guided into beam shaping optical system 2 comprised of a cylinder lens and a beam expander, for example, in which a cross-sectional shape of the beam is shaped so as to efficiently enter subsequent fly's eye lens 5. The excimer laser light source 1 is a KrF excimer laser light source (resonance wavelength is 248 nm), or an ArF excimer laser light source (resonance wavelength is 193 nm), or the like. The illumination light source may be a pulsed light source such as a metal vapor laser light source or a harmonic generator of YAG laser.

Figure 2:
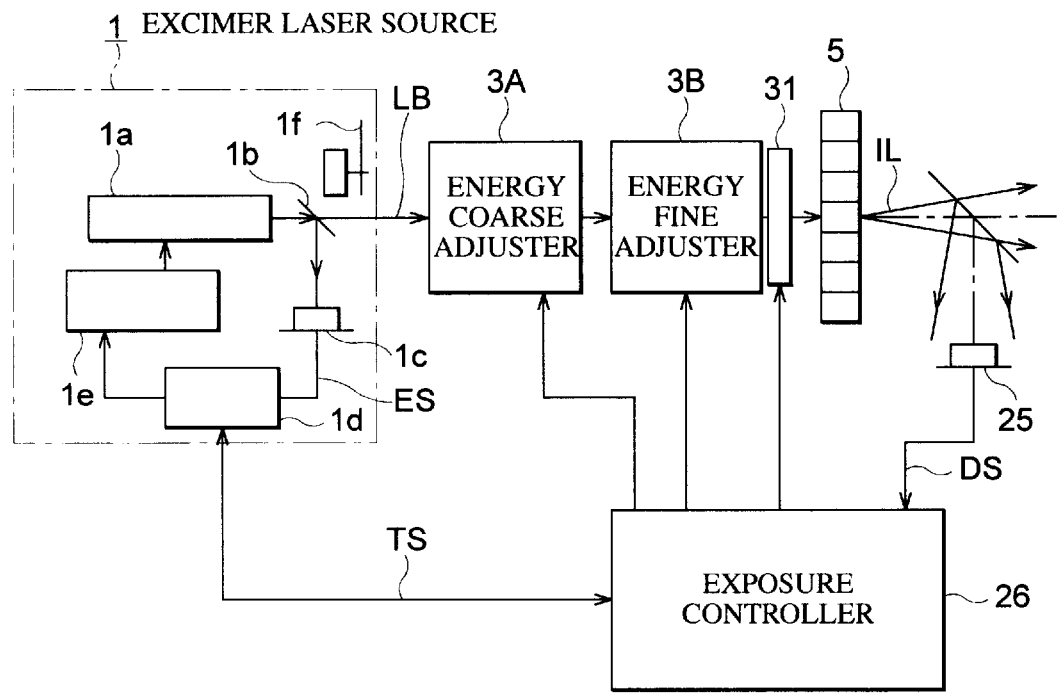
FIG. 2 is a block diagram to show a light exposure controlling system in the apparatus of FIG. 1.
Figure 7A:
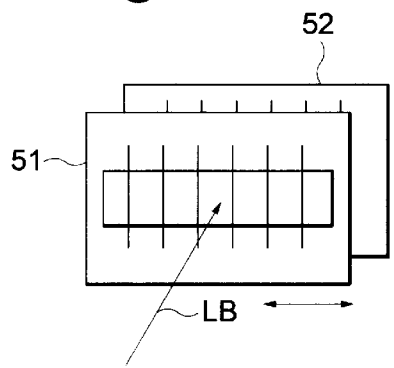
FIGS. 7A and 7B are structural drawings to show examples of the conventional energy fine adjusters.
Figure 7B:
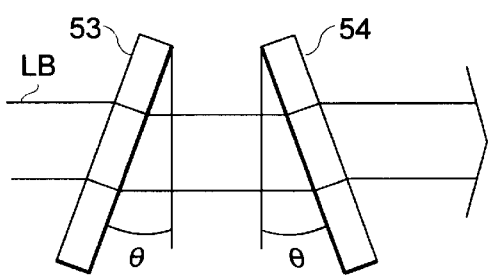
Figure 8A:
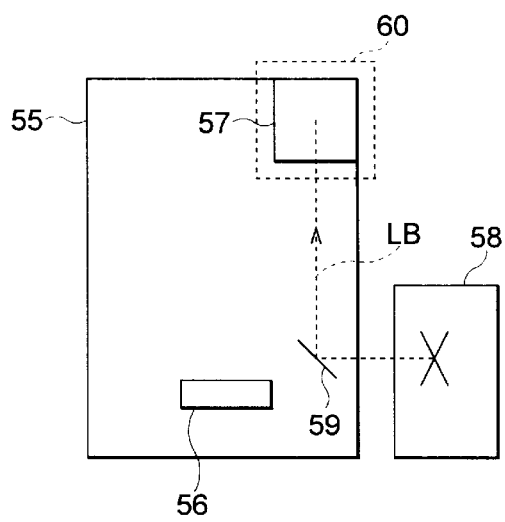
FIGS. 8A and 8B are explanatory drawings to illustrate an example where the optical axis offset appears depending upon the position to be exposed.
Figure 8B:
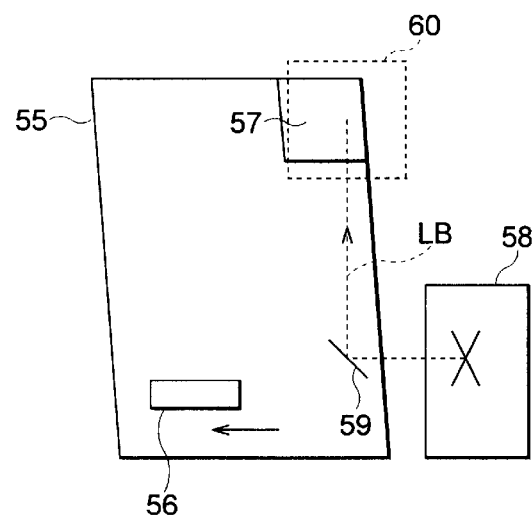

The laser beam LB coming out of the beam shaping optical system 2 is then incident to energy modulator 3. The energy modulator 3 is composed of energy coarse adjuster 3A and energy fine adjuster 3B, as shown in FIG. 2. The energy coarse adjuster 3A is constructed of a plurality of ND filters with different transmittances (=1—attenuation rates) disposed on a rotatable revolver. By rotating the revolver, the transmittances for the incident laser beam LB can be switched one from another in plural steps from 100% to a predetermined transmittance. It may also be contemplated that two revolvers, similar to the aforementioned revolver, are provided so that the transmittances can be adjusted in finer steps by a combination of two ND filters. On the other hand, the energy fine adjuster 3B is of the double grating type as shown in FIG. 7A or of the combination type of two parallel glass plates capable of changing their inclination angle as shown in FIG. 7B, and it continuously finely adjusts the transmittance for the laser beam LB within a predetermined range. Instead of use of this energy fine adjuster 3B, the energy of laser beam LB may be finely adjusted by modulation of output of the excimer laser light source 1.

In FIG. 1, the laser beam LB coming out of the energy modulator 3 is guided via mirror M for bending the optical path into fly's eye lens 5. In this embodiment, the excimer laser light source 1, beam shaping optical system 2, and energy modulator 3 are installed at a position separated from a chamber for housing the main body of exposure apparatus including the fly's eye lens 5 and components thereafter. The laser beam LB from the energy modulator 3 is supplied through the light sending optical system including the mirror M, to the fly's eye lens 5. The fly's eye lens 5 forms many secondary light sources for illuminating subsequent reticle 11 in uniform illuminance distribution. An aperture stop (so called as σ stop) 6 of the illumination system is located on the exit plane of the fly's eye lens 5. Laser beams emitted from the secondary light sources within the aperture stop 6 (which will be referred to as "pulsed illumination light IL") are incident to beam splitter 7 having a small reflectance and a large transmittance. The pulsed illumination light IL as irradiation light, having been transmitted by the beam splitter 7, travels through first relay lens 8A and then passes a rectangular aperture portion of fixed field stop (fixed reticle blind) 9A. The fixed field stop 9A is located near a plane conjugate with the pattern surface of the reticle. Another movable field stop 9B, having an aperture portion with variable position and width in the scanning direction, is also located near the fixed field stop 9A. At start or at end of scanning projection on the illumination field is further limited by the movable field stop 9B, whereby unnecessary exposed portions can be prevented The pulsed illumination light IL, having passed the fixed field stop 9A and movable field stop 9B, then travels through second relay lens 8B and condenser lens 10 to illuminate a rectangular illumination region 12R in uniform illuminance distribution on the reticle 11 held on reticle stage 15. A pattern in the illumination region 12R on the reticle 11 is demagnified through projection optical system 13 to form a demagnified image at a projection magnification α (for example, α is ¼, ⅕, etc.), which is projected to the illumination field 12W on the wafer 14 coated with a photoresist. The description hereinafter is based on the coordinate system in which the Z-axis is taken in parallel with the optic axis AX of the projection optical system 13, the Y-direction along the scanning direction of the reticle 11 relative to the illumination region 12R in the plane normal to the optic axis AX (i.e., along a direction parallel to the plane of FIG. 1), and the X-direction along a non-scanning direction normal to the scanning direction.

At this time the reticle stage 15 is moved in the Y-direction by reticle stage driver 18. A Y-coordinate of the reticle stage 15 measured by external laser interferometer 16 is supplied to stage controller 17 and the stage controller 17 controls the position and speed of the reticle stage 15 through the reticle stage driver 18, based on the coordinate thus supplied.

On the other hand, the wafer 14 is mounted on Z-tilt stage 19 through a wafer holder not illustrated, and the Z-tilt stage 19 is mounted on XY stage 20. The XY stage 20 positions the wafer 14 in the X-direction and in the Y-direction and moves the wafer W in the Y-direction. The Z-tilt stage 19 adjusts the Z-directional position (the focus position) of the wafer 14 and has a function to adjust an angle of inclination of the wafer 14 relative to the XY plane. X- and Y-coordinates of the XY stage 20 (wafer 14), measured by a moving mirror fixed on the Z-tilt stage 19 and external laser interferometer 22, are supplied to the stage controller 17, and the stage controller 17 controls the position and speed of the XY stage 20 through wafer stage driver 23, based on the coordinates thus supplied.

The operation of the stage controller 17 is controlled by a chief control system for generally controlling the entire apparatus, not illustrated. During the scanning projection the reticle 11 is moved at velocity $V_R$ in the positive Y-direction (or in the negative Y-direction) through the reticle stage 15 and, in synchronism with it, the wafer 14 is moved at the velocity $\alpha V_R$, (where α is the projection magnification from the reticle 11 to the wafer 14) in the negative Y-direction (or in the positive Y-direction) relative to the illumination field 12W through the XY stage 20.

Illuminance uniformity sensor 21 comprised of a photoelectric conversion element is permanently provided near the wafer 14 on the Z-tilt stage 19 and a photoreceptive surface of the illuminance uniformity sensor 21 is set at the same height as the surface of the wafer 14. The illuminance uniformity sensor 21 is, for example, a pin photodiode which is sensitive to the far ultraviolet region and which has a high response frequency for detecting the pulsed illumination light. A detection signal from the illuminance uniformity sensor 21 is supplied through a peak hold circuit and an analog/digital (A/D) converter, not illustrated, to exposure controller 26.

Returning to the illumination system of FIG. 1, the pulsed illumination light IL reflected by the beam splitter 7 is received by integrator sensor 25 comprised of a photoelectric conversion element, through condenser lens 24, and a photoelectric conversion signal from the integrator sensor 25 is supplied as output DS through a peak hold circuit and an A/D converter, not illustrated, to the exposure controller 26. Coefficients of correlation between the output DS of the integrator sensor 25 and the illuminance (light exposure) of the pulsed illumination light IL on the surface of the wafer 14 are preliminarily obtained and are stored in the exposure controller 26. The exposure controller 26 controls the emission timing and emission power or the like of the excimer laser light source 1 by supplying control information TS to the excimer laser light source 1. The exposure controller 26 further controls the attenuation rate in the energy modulator 3 and the stage controller 17 controls the open/close operation of the movable field stop 9B in synchronism with operation information of the stage system.

The structure of the light exposure controlling system in this embodiment will be described below referring to FIGS. 2.

FIG. 2 shows the light exposure controlling system in the projection exposure apparatus of FIG. 1 Inside the excimer laser light source 1 of this FIG. 2, the laser beam emitted in the pulse form from laser resonator 1a is incident to beam splitter 1b having a large transmittance and a small reflectance, and the laser beam LB, having been transmitted by the beam splitter 1b, is guided via the beam shaping optical system not illustrated, energy coarse adjuster 3A, energy fine adjuster 3B, optic axis offset correction unit 31, and the beam sending optical system not illustrated to the fly's eye lens 5 outside the light source The laser beam reflected by the beam splitter 1b is incident to energy monitor 1c comprised of a photoelectric conversion element and a photoelectric conversion signal from the energy monitor 1c is supplied as output ES through a peak hold circuit not illustrated to energy controller 1d. Also in this case, coefficients of correlation between the output ES from the energy monitor 1c and the illuminance (light exposure) of the pulsed illumination light IL on the surface of the wafer 14 are preliminarily obtained, for example, in such a state that the transmittance in the energy modulator 3 is set to the maximum, and they are stored in the exposure controller 26. The exposure controller 26 reduces the energy per pulse of the pulsed illumination light IL to an output of the energy monitor 1c and supplies it as a target value to the energy controller 1d.

Upon normal emission the energy controller 1d controls the supply voltage in high-voltage power supply 1e so that the output ES of the energy monitor 1c becomes the energy per pulse supplied from the exposure controller 26. The energy per pulse in the laser resonator 1a is determined according to the supply voltage. The energy per pulse of the excimer laser light source 1 is normally stabilized at predetermined center energy $E_0$ and is arranged to vary in a predetermined range around the center energy $E_0$. Thus, modulation of the output from the excimer laser light source 1 can replace the energy fine adjuster 3B of FIG. 2.

On the other hand, when the output change of the excimer laser light source 1 itself is measured for producing a correction data map of light exposure as described hereinafter, the output ES from the energy monitor 1c is supplied through the energy controller 1d to the exposure controller 26. A shutter 1f for intercepting the laser beam LB according to control information from the exposure controller 26 is also located outside the beam splitter 1b in the excimer laser light source 1.

Further, in FIG. 2, the optic axis offset correction unit 31 disposed between the energy fine adjuster 3B and the fly's eye lens 5 is composed of a biaxial parallel glass plate (halving) for correcting the two-dimensional position of the laser beam LB and a mirror (an angle mirror) capable of changing the angle of inclination, for correction of angle. The position and angle of the laser beam LB are arranged to be controlled by the exposure controller 26. In this embodiment, an offset of the optic axis over a permissible range due to the secular change or the like is corrected by use of the optic axis offset correction unit 31.

Upon the scanning projection the exposure controller 26 sends predetermined control information TS to the energy controller 1d to make the excimer laser light source 1 emit pulses and integrates the output DS from the integrator sensor 25 every pulse of the pulsed illumination light to successively obtain an integrated light exposure at each point on the wafer 14. Then the exposure controller 26 adjusts the attenuation rate in the energy coarse adjuster 3A and finely adjusts the transmittance in the energy fine adjuster 3B so that the integrated light exposure becomes the set light exposure for the photoresist on the wafer 14.

An example of the light exposure control operation (the exposure dose control operation) in the projection exposure apparatus of this embodiment will be described in detail.

I. Shot-by-Shot Light Exposure Control Operation

First described is the fundamental light exposure control operation in the projection exposure apparatus of this embodiment. Since the attenuation rate for the laser beam LB from the excimer laser light source 1 of FIG. 2 can be set well by the energy coarse adjuster 3A so that the number of exposure pulses is not less than the necessary exposure pulse number, the description is focused herein on the fine modulation operation of energy of the laser beam LB by the energy fine adjuster 3B.

First, quantities used in the description hereinafter are defined as follows.

(a) $S_0$: light exposure (set light exposure) set by an operator and being to be given to the photoresist on the wafer.

(b) N: number of beam pulses of the pulsed illumination light IL irradiated per point on the wafer.

(c) P: average pulse energy density (mJ/(cm²·pulse)) on the Image plane, indirectly measured by the integrator sensor 25.

(d) $A_{rep}$: repeatability of light exposure per point on the wafer.

(e) $A_t$: target error for error of an average light exposure in each shot area on an actual wafer with respect to the set light exposure (target accuracy of light exposure).

(f) $A_E$: permissible integrated light exposure accuracy for the desired, set light exposure per point on the wafer. Namely, the following equation holds.

$$A_E = A_{rep} + A_t \quad (2)$$

(g) $S_{AVE}$: average integrated light exposure (mJ/(cm²·pulse)) in one shot area on the wafer.

The normal shot-by-shot light exposure control operation is as follows. First, the operator sets the set light exposure $S_0$ for the photoresist on the wafer toward the exposure controller 26 of FIG. 1 In response thereto the exposure controller 26 sets the set value of energy per pulse of the laser beam LB to the center energy $E_0$. Then the exposure controller 26 makes the excimer laser light source 1 emit a plurality of pulses (for example, several hundred pulses) and integrates the output of the integrator sensor 25, thereby indirectly measuring the average pulse energy density P (mJ/(cm²·pulse)) on the wafer. Thereafter, the controller calculates the exposure pulse number N, for example, by rounding off $S_0/P$ to the nearest integer. In this case, the attenuation rate in the energy coarse adjuster 3A is set so that the exposure pulse number N is not smaller than the minimum exposure pulse number $N_{min}$ necessary for the predetermined repeatability of light exposure $A_{rep}$.

Then the exposure controller 26 sets the transmittance in the energy fine adjuster 3B of FIG. 2 so that the value of $S_0/P$ is an integer (exposure pulse number) N. In this state the emission of pulse of the excimer laser light source 1 is started and the scanning projection onto the first shot area on the wafer 14 is carried out. Upon this scanning projection the exposure controller 26 takes the output DS of the integrator sensor 25 in to calculate the integrated light exposure $S_k$ of N pulses till then every pulse. Namely, letting $P_k$ be the light exposure (pulse energy density) measured by the integrator sensor 25 with the k-th (k≧N) pulse of the pulsed illumination light IL, the integrated light exposure $S_k$ in the pertinent area is given as follows.

$$S_k = P_k + P_{k-1} + \ldots{}_{-M} + P_{k-N-2} + P_{k-N+1} \quad (3)$$

This integrated light exposure $s_k$ (k=N, N+1, N+2, . . . ) represents integrated light exposures at respective points adjacent in the scanning direction within a shot area on the wafer 14. Then it is determined whether an error of each integrated light exposure $S_k$ from the set light exposure $S_0$ is not more than the permissible integrated light exposure accuracy $A_E$.

$$|1 - S_k/S_0| \leq A_E \quad (4)$$

When Eq. (4) holds, the integrated light exposures are appropriate at the respective points inside the shot area. Therefore, the pulse energy does not have to be corrected for exposure of the next shot area. This means that the scanning exposure is also carried out for the second shot area without changing the transmittance in the energy fine adjuster 3B. In contrast, when Eq. (4) does not hold, the repeatability of light exposure $A_{rep}$ is calculated from the following equation, using the maximum integrated light exposure $S_{max}$ and the minimum integrated light exposure $S_{min}$ in the shot area, for determining if it is either a phenomenon due to variation among the integrated light exposures at the respective points or is an offset-like phenomenon due to deviation of the average pulse energy in the shot area.

$$A_{rep} = (S_{max} - S_{min})/(S_{max} + S_{min}) \quad (5)$$

Then the repeatability of light exposure $A_{rep}$ obtained is compared with a predetermined specification value of repeatability of light exposure, $(A_{rep})_{spec}$. When $A_{rep} \geq (A_{rep})_{spec}$, the variation in the pulse energy in the excimer laser light source 1 is not acceptable. Then the exposure controller 26 sends alarm information to the energy controller 1d of the excimer laser light source 1. In response thereto, the energy controller 1d goes into a self-return operation. As an example, the energy controller 1d stops the emission operation by closing the shutter 1f, thereafter checks a concentration of the gas for emission of laser etc. (self-check), and then makes lasing normal (self-lock).

When the cause to hinder Eq. (4) from holding is the offset-like phenomenon due to the deviation of the average pulse energy, for example, the average value $S_{AVE}$ of the all integrated light exposures $S_k$ obtained in the first shot area is calculated and a ratio of the average value $S_{AVE}$ to the set light exposure $S_0$ (=$S_{AVE}/S_0$) is stored as a correction coefficient. Then, when the next second shot area is exposed, the scanning projection is carried out after the transmittance in the energy fine adjuster 3B is corrected by the inverse of the correction coefficient ($S_{AVE}/S_0$). After that, the light exposures in the following shot areas are corrected in the same manner, based on the actual light exposures in the shot area immediately before This permits the light exposure in each shot area to be maintained at the set light exposure $S_0$ with desired accuracy even in the light exposure control of the open loop.

II. Production of Correction Data Map of Light Exposure (Exposure Dose) Depending upon Position to Be Exposed Even with the shot-by-shot light exposure control as described above, there will occur some cases wherein correction for the light exposure is not sufficient because of occurrence of an optic axis offset between the excimer laser light source 1 and the fly's eye lens 5 when change is great in the position of shot area to be exposed on the wafer or when a shift is made to the next row or the next column of shot area. Then the correction data map of light exposure depending upon the position to be exposed is made as follows.

First, assuming the output of the excimer laser light source 1 of FIG. 1 is sufficiently stable. The cause of the variation in light exposure is assumed to depend upon only the position to be exposed.

Figure 3:
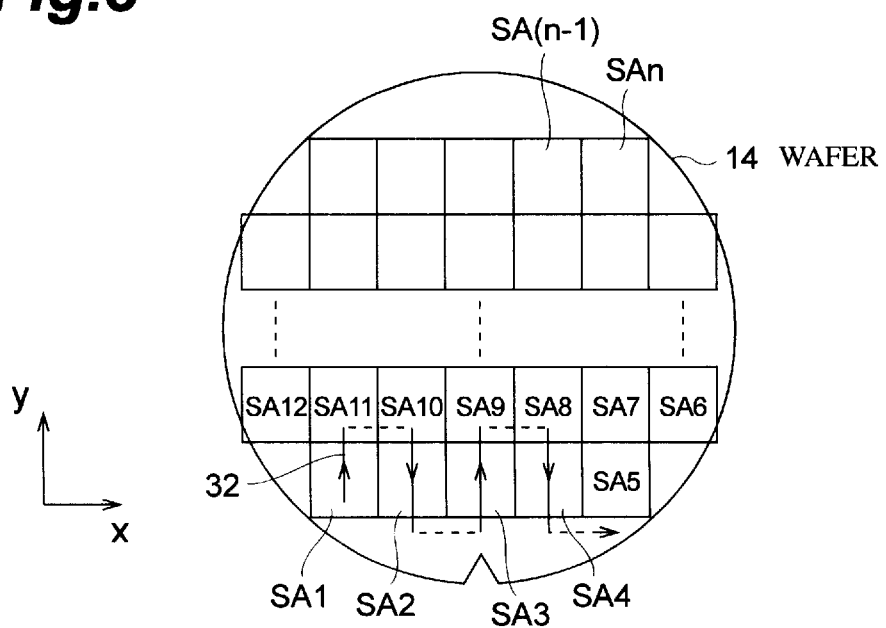
FIG. 3 is a plan view to show an example of the shot array on a wafer.

FIG. 3 shows an example of the shot array on the wafer 14. In this FIG. 3, n (n is, for example, an integer not less than 5) shot areas SA1, SA2, . . . SA (n−1), SAn are arrayed at predetermined pitch in the X-direction and in the Y-direction on the wafer 14. For measuring variations of light exposure at positions (positions to be exposed) of these shot areas SAi (i=1 to n), the scanning projection is carried out, for example, using a wafer for evaluation, which is the same as the wafer 14, in a predetermined projection sequence, i.e., in the order of symbols i for the shot areas SAi of the evaluation wafer with the set light exposure being $S_0$ and without carrying out the shot-by-shot light exposure control. FIG. 3 shows a trace 32 on which the illumination field 12W of FIG. 1 moves relative to the shot areas SAi. In this case, the illumination field 12W is actually stationary, but the evaluation wafer is moved by the XY stage 20 of FIG. 1 Upon the scanning projection the exposure controller 26 successively takes the output DS of the integrator sensor 25 in, calculates the average value $S_{AVE}$ of sequential integrated light exposures $S_k$ of Eq. (3) in each shot area SAi, and further obtains the average pulse energy p(i) by dividing this average value $S_{AVE}$ by the exposure pulse number N per point on the wafer.

Figure 5:
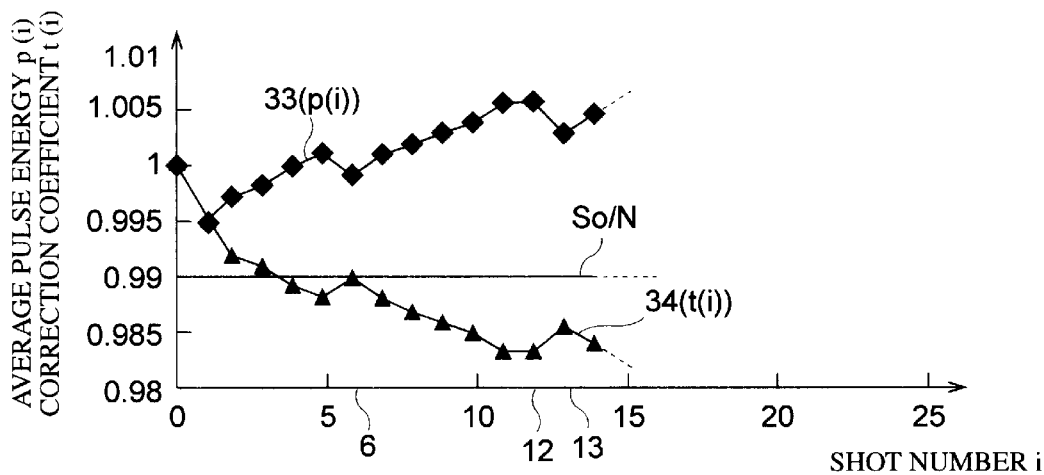
FIG. 5 is a drawing to show the relation between shot number and correction coefficient (correction map)

Broken line 33 of FIG. 5 indicates the measurement results of the average pulse energy in each shot area. The abscissa of FIG. 5 indicates numbers (shot numbers) i of shot areas SAi and the ordinate average pulse energies p(i) in the i-th shot areas SAi. The average pulse energy p(0) at the shot number of zero is the average pulse energy (i.e., P) measured when the excimer laser light source 1 is made to emit a predetermined number of pulses before the projection, and the other average pulse energies p(i) are normalized by p(0).

In FIG. 5, the average pulse energies p(i) gradually change because of the change in the position of the XY stage 20 of FIG. 1, depending upon the position of each shot area SAi to be exposed. When the shot area to be exposed is shifted to the next row or to the next column, for example, as in the case of movement from the fifth shot area to the sixth shot area or in the case of movement from the twelfth shot area to the thirteenth shot area, the deviation of average pulse energy becomes greater as emphatically indicated by the broken line 33.

The average pulse energy $S_0/N$, corresponding to the set light exposure $S_0$, is provisionally indicated as 0.99 in FIG. 5. Namely, 0.99 is the target set energy in FIG. 5. It is seen from FIG. 5 that the variation rate of the average pulse energy p(i) in the i-th shot area SAi to the target value $S_0/N$ is $p(i)/(S_0/N)$. Accordingly, the set light exposure $S_0$ in the i-th shot area SAi can be obtained by multiplying the transmittance:in the energy fine adjuster 3B by the following correction coefficient t(i), which is the inverse of the variation rate.

$$t(i)=(S_0/N)/p(i)=S_0/(p(i)\cdot N) \qquad (6)$$

Broken line 34 of FIG. 5 indicates correction coefficients t(i) in the i-th shot areas SAi, The exposure controller 26 of this example stores, in the form of a correction data map, data obtained by assigning the correction coefficients t(i) to the respective shot areas SAi of FIG. 3.

Next, a correction method of light exposure using the correction data map will be described. Shot areas to be exposed are selected according to an arbitrary projecting sequence set by the operator. Let us consider an example in which projection is effected in five shot areas SB1 to SB5, discretely located on the wafer 14A as shown in FIG. 4, in the order of from SB1 to SB5.

Figure 4:
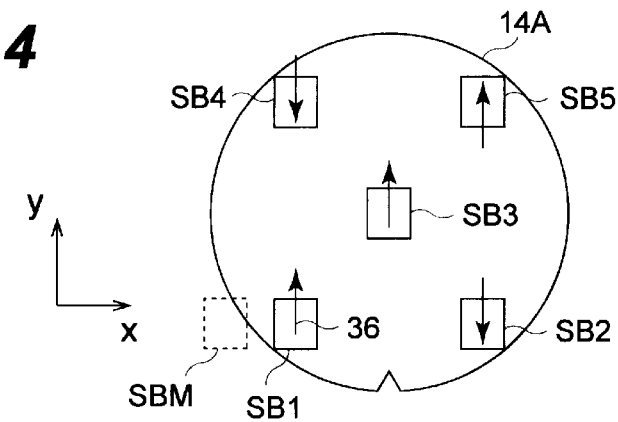
FIG. 4 is a plan view to show shot areas discretely arrayed to be exposed.

The wafer 14A of FIG. 4 is a wafer having the same shape as the wafer 14 of FIG. 3, and the five shot areas SB1 to SB5 on the wafer 14A are shot areas arbitrarily selected from the n shot areas SA1 to SAn on the wafer 14. In this case, the exposure controller 26 of the projection exposure apparatus of FIG. 1 makes the excimer laser light source 1 emit a plurality of pulses before the projection, measures the average pulse energy density P on the wafer through the integrator sensor 25, and sets the transmittance $T_{fine}$ in the energy fine adjuster 3B with respect to the set light exposure $S_0$, for example, so that $S_0/P$ is an integer. Supposing the first shot area SB1 of FIG. 4 is the first shot area of FIG. 3, the controller reads the correction coefficient t(1) (=$S_0/(p(1)\cdot N)$) having the shot number of 1 from the correction map of FIG. 5 and sets the transmittance $T_{fine}\cdot t(1)$ obtained by multiplying the transmittance $T_{fine}$ by the correction coefficient t(1), as the transmittance in the energy fine adjuster 3B. Thereafter, the scanning projection is carried out for the shot area SB1. The relative scan direction of the illumination field 12W to the wafer 14A in this case is indicated by arrow 36.

When the projection is effected in the other shot areas SB2 to SB5 of FIG. 4, the scanning projection is carried out similarly in such a manner that, assuming the pertinent shot area is the i-th shot area SAi of FIG. 3 and using the i-th correction coefficient t(i), the transmittance $T_{fine}\cdot t(i)$ is set as the transmittance in the energy fine adjuster 3B, thereby correcting the variation in the average pulse energy due to the optic axis offset depending upon the position to be exposed and giving an appropriate light exposure for each shot area. Upon the measurement of the average pulse energy density P, the measurement is desired to be carried out in such a state that an area SBM close to the first shot area SB1 in FIG. 4 is within the exposed region by the projection optical system 13. This decreases the error of light exposure in the shot area SB1 first exposed.

III. Update of Correction Data Map of Light Exposure

As described above, the variation in the light exposure depending upon the position to be exposed can be corrected by using the correction data map of light exposure. However, the correction data map changes with a lapse of time to some extent because of the secular change of the exposure apparatus body and the installation environment of exposure apparatus, the secular change of the beam intensity distribution of the laser beam LB in the excimer laser light source 1, or the like. Therefore, the correction data map should desirably be updated in order to compensate for such secular change of correction data map.

For example, in the case wherein exposure is made for wafers of one lot having the shot areas shown in FIG. 4, the projection is carried out for the first wafer by setting the fine adjustment amount of energy (the transmittance in the energy fine adjuster 3B) based on the correction data map of FIG. 5. Upon this actual projection the actual average pulse energy $P_i$ is measured based on the output of the integrator sensor 25 in each shot area SB1 to SB5 of FIG. 4, and each of the average pulse energies p(i) of the broken line 33 of FIG. 5 is replaced by a value obtained by dividing the actual average pulse energy $P_i$ by the fine adjustment amount (transmittance) of energy in the pertinent shot, $T_{fine}\cdot t(i)$. After that, the correction coefficients t(i) are calculated using the actual average pulse energies p(i) thus updated, and the fine adjustment amount of energy is set based on the updated correction data map upon carrying out the projection for the second wafer This can compensate for the secular change of the correction data map.

IV. Production of Correction Data Map Taking Account of Output Change of Laser Beam The above examples were described assuming that the output of the excimer laser light source 1 was sufficiently stable and that the variation in the light exposure was due to only the position to be exposed, but the output of the excimer laser light source 1 will vary even during the projection in practice. In order to carry out higher-accuracy light exposure control, it is desired to produce the correction data map by resolving the variation into that of the output of the excimer laser light source 1 and that of the average pulse energy depending upon the position to be exposed. For that purpose, upon projection for evaluation based on the projection sequence of FIG. 3; the exposure controller 26 measures the average pulse energy p(i) for each shot area SAi (i=1 to n) through the integrator sensor 25 and, in tandem with it, takes in the output ES of the energy monitor 1c of FIG. 2, which is directly monitoring the output of the excimer laser light source 1, to calculate average pulse energy (a value reduced to a light exposure on the image plane) b(i) of the excimer laser light source 1 itself during projection onto each shot area SAi.

Figure 6:
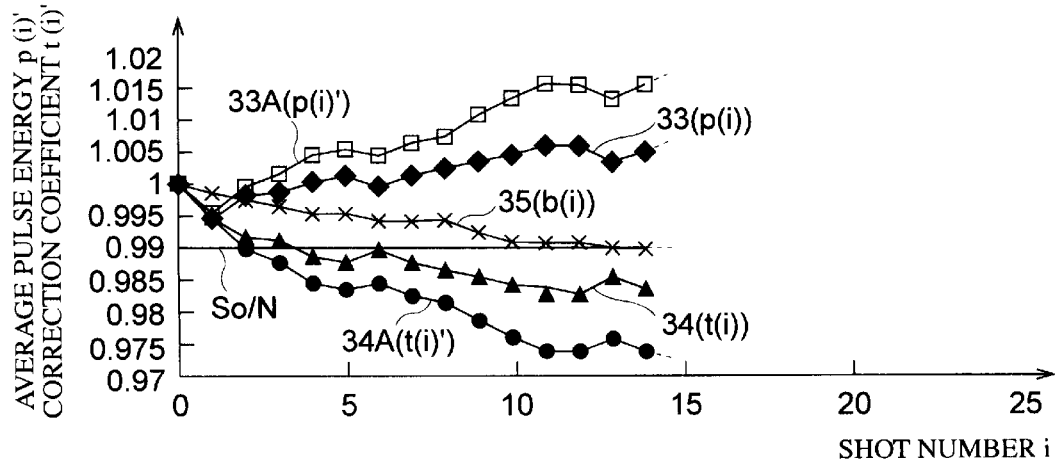
FIG. 6 is a drawing to show the relation between shot number and correction coefficient taking account of the output variation of the laser light source (correction data map)

FIG. 6 shows the average pulse energy p(i) on the image plane, the average pulse energy b(i) of the excimer laser light source 1 itself, etc. and in this FIG. 6 the abscissa indicates the shot number i. The ordinate of broken line 33 represents the average pulse energy p(i) in the i-th shot area and the ordinate of broken line 35 the average pulse energy b(i) of the excimer laser light source 1 itself. In this example the values of p(i) and b(i) are also normalized by the average pulse energy p(0) measured before the projection. FIG. 6 also indicates the reference value of average pulse energy $S_0/N$ and the correction coefficients taking no account of the output change of the laser light source and indicated by the broken line 34 (which will be referred to as "first correction coefficients"), t(i), as also illustrated in FIG. 5. Namely, t(i) is expressed by Eq. (6).

With the measurement data of FIG. 6, the exposure controller 26 first divides the average pulse energy p(i) in the i-th shot area by the corresponding average pulse energy b(i) of the excimer laser light source 1 itself, thereby obtaining corrected average pulse energy p(i)' as described by the below equation. This means that the output change of the excimer laser light source 1 itself is corrected thereby.

$$p(i)'=p(i)/b(i) \tag{7}$$

Then the reference value of average pulse energy $S_0/N$ is divided by the corrected average pulse energy p(i)' as described below, thereby calculating second correction coefficient t(i)' corrected in the output change of the excimer laser light source 1 itself.

$$t(i)'=(S_0/N)/p(i)' \tag{8}$$

FIG. 6 shows the corrected average pulse energies p(i)' and second correction coefficients t(i)' by broken lines 33A and 34A, respectively. The exposure controller 26 stores in the form of a correction map a file obtained by assigning the second correction coefficients t(i)' to the respective shot areas SAi and, upon carrying out projection thereafter, the controller controls the fine adjustment amount of energy in each shot area using the correction map. This permits the controller to perform the light exposure control with high accuracy, based on the correction map obtained by canceling the output change, even in the case wherein the output change of the excimer laser light source 1 appears upon production of the correction map.

V. Correction for Secular Optic Axis Offset

Next, in the case wherein the secular optic axis offset appears between the excimer laser light source 1 and the fly's eye lens 5 of the exposure apparatus body for some reason other than the position to be exposed and wherein an amount of the offset is large, when the position of shot area is further changed, the variation becomes great in the uptake light amount into the fly's eye lens 5. As a result, the corrected average pulse energies p(i)' indicated by the broken line 33A in FIG. 6 will demonstrate great variation with movement of position to be exposed and fail to satisfy the desired target light exposure accuracy. As a consequence of this, whether the variation in the light exposure is due to the great optic axis offset or not can be determined by monitoring the correction average pulse energy p(i)' for each shot area and checking if a variation amount of this correction average pulse energy p(i)' is off a certain range. When a wafer is exposed according to a certain projection sequence and using, for example, the correction data map of FIG. 6 and, for example, when there occurs failure in the target light exposure accuracy due to the optic axis offset at 1% or more of exposed points in the all exposed shot areas, the exposure controller 26 goes into the operation in a self-alignment mode, for example, to make the optic axis offset correction unit 31 of FIG. 2 operate so as to keep the laser beam LB from the excimer laser light source 1 incident to the entire entrance surface of the fly's eye lens 5. This corrects the optic axis offset, whereby the light exposure control can again be carried out with high accuracy.

Namely, the correction of average pulse energy is not effected well with large amounts of optic axis offset, because the correction data map itself, originally produced, includes large errors In addition, when a stepping amount is large, the variation is also large in the uptake light amount (i.e., the illuminance) into the fly's eye lens 5 against the optic axis offset due to the reaction force. Therefore, the repeatability of light exposure $A_{rep}$ also degrades. Accordingly, the optic axis offset needs to be driven into a predetermined range to some extent.

As another arrangement, the exposure controller 26 may be arranged to emit an alarm to the operator when a large optic axis offset appears. In response thereto the operator will perform adjustment of the optic axis, thereby correcting the optic axis offset.

When the correction data map of FIG. 6 is produced, the average pulse energy b(i) of the excimer laser light source 1 itself is measured. When this measurement result is smaller than the predetermined permissible range of variation, the exposure controller 26 generates a command to restore the output stability to the excimer laser light source 1. In response thereto the excimer laser light source 1 performs the operation to restore the output stability by carrying out the self-lock described above this enables to monitor the output stability of the excimer laser light source 1, thereby achieving the desired light exposure control accuracy over a long period of time The above-stated embodiment is an example in which the present invention is applied to the projection exposure apparatus of the step-and-scan method using the pulsed light source, but it is needless to mention that the present invention is also effective for the light exposure control with the projection exposure apparatus of the step-and-scan method using a continuous light source such as a mercury lamp, as an illumination light source. Further, the present invention can also be applied to the light exposure control in the full wafer projection exposure apparatus such as steppers. As described, the present invention is by no means limited to the above embodiment, but it may encompass various modifications and arrangements within the range not departing from the spirit and scope of the present invention.

Since the light exposure controlling method of the present invention is arranged to correct the light exposure by the predictive control using the correction data map in accordance with the position of each shot area to be exposed by the exposure apparatus, it has the advantage that each of the light exposures for the shot areas can be controlled in the appropriate range with high accuracy even if the illuminance of the illumination light to the photosensitive substrate varies depending upon the position (position to be exposed) of each shot area on the photosensitive substrate. According to this arrangementf the appropriate light exposure can also be attained in the first shot of the second or later photosensitive substrate and the appropriate light exposure can be obtained even when the instantaneous reaction force, for example upon start of a new line of shot area, causes change in posture or deformation of the exposure apparatus body.

When the method is arranged to update the correction data map, based on the exposure results till then, upon performing projections in predetermined shot areas on another photosensitive substrate after the projection on the photosensitive substrate to be exposed, the method can compensate for the secular optic axis offset or the like.

In performing successive irradiation in predetermined shot areas on another photosensitive substrate after the projection on the photosensitive substrate to be exposed, when projection is made in a shot area close to one exposed immediately before it, the light exposure is corrected based on the actual light exposure in the shot area immediately before; or, when projection is made in a shot area greatly distant from the one exposed immediately before it, the light exposure is corrected using the correction data map; whereby a desired light exposure can be obtained even if an optic axis offset appears due to great change in the position to be exposed.

In the case wherein the illuminance of the illumination light is measured inside or immediately after the illumination light source upon projection on the photosensitive substrate for evaluation or upon projection on the photosensitive substrate to be exposed, wherein each correction amount of the correction data map is resolved, based on the illuminance thus measured, into the first component due to the positional deviation of the optic axis of the illumination light according to the position of the predetermined shot area and the second component due to the output change of the illumination light source itself, and wherein the light exposure for each predetermined shot area is corrected based on the first component, the correction data map excluding the influence of the output change can be produced accurately even with the output change of the illumination light source.

In the case wherein, in resolving each correction amount of the correction data map into the first component due to the positional deviation of the optic axis of the illumination light and the second component due to the output change of the illumination light source itself, the optic axis of the illumination light is corrected when the first component exceeds the predetermined permissible amount, the light exposure control can be carried out with high accuracy by correcting the great optic axis offset.

When the exposure apparatus is a scanning projection type exposure apparatus for performing the projection on each shot area of the photosensitive substrate by synchronously scanning the mask and the photosensitive substrate to be exposed relative to the illumination light, the light exposure control can be carried out in the open loop with high accuracy.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A light exposure controlling method adapted for a projection exposure apparatus for illuminating a mask with illumination light emitted from an illumination light source and successively projecting a pattern formed on the mask to each of plural shot areas provided on a substrate, said light exposure controlling method controlling a light exposure given by said illumination light for each of said shot areas, said light exposure controlling method comprising the steps of:

detecting an energy of said illumination light previous to said light exposure; and obtaining light exposure correction data for each of said plural shot areas responsive to variations in the energy of said illumination light irradiated to said substrate so as to achieve an appropriate light exposure for each of said plural shot areas previous to said light exposure.

2. A light exposure controlling method according to claim 1, said light exposure correction data is obtained from performing projection on an evaluation substrate by use of said exposure apparatus in accordance with a predetermined projection sequence for plural shot areas, measuring an actual light exposure at a position corresponding to each of said plural shot areas.

3. A light exposure controlling method according to claim 1, said light exposure controlling method further comprising steps:

measuring illuminance of said illumination light from the illumination light source;

based on the illuminance thus measured, resolving a change between an actual light exposure and a desired light exposure into a first component due to positional deviation of the optic axis of said illumination light occurring depending upon a position of each of said plural shot areas and a second component due to output change of said illumination light source itself; and correcting the light exposure for each of said plural shot areas according to said correction data based on said first component.

4. A light exposure controlling method according to claim 3, wherein when said first component exceeds a predetermined permissible amount, the optic axis of said illumination light is corrected, thereby performing correction of light exposure.

5. A light exposure controlling method according to claim 1, wherein said exposure apparatus is a scanning projection exposure apparatus for projecting onto each shot area on the substrate by synchronously scanning said mask and said substrate relative to said illumination light.

6. A light exposure controlling method according to claim 1 wherein, upon continuously projecting a plural substrates in accordance with a predetermined projection sequence, said correction data is updated based on an exposure result of an exposed substrate.

7. A light exposure controlling method according to claim 6, said light exposure controlling method further comprising steps:

measuring illuminance of the illumination light from the illumination light source;

based on the illuminance thus measured, resolving a change between an actual light exposure and a desired light exposure into a first component due to positional deviation of the optic axis of said illumination light occurring depending upon a position of each of said plural shot areas and a second component due to output change of said illumination light source itself; and correcting the light exposure for each of said plural shot areas according to said correction data based on said first component.

8. A light exposure controlling method according to claim 7, wherein when said first component exceeds a predetermined permissible amount, the optic axis of said illumination light is corrected, thereby performing correction of light exposure.

9. A light exposure controlling method according to claim 6, wherein said exposure apparatus is a scanning projection exposure apparatus for projecting onto each shot area on the substrate by synchronously scanning said mask and said substrate relative to said illumination light.

10. A light exposure controlling method according to claim 1, wherein, upon projecting on a substrate in accordance with a predetermined projection sequence, correction of light exposure is carried out in such a manner that when a shot area close to a shot area exposed immediately before it is exposed, the correction of light exposure for the shot area is carried out based on an exposure result in the shot area exposed immediately before it, and that when a shot area distant from a shot area exposed immediately before it is exposed, the correction of light exposure for the shot area is carried out using said correction data map.

11. A light exposure controlling method according to claim 10, said light exposure controlling method further comprising steps:

measuring illuminance of the illumination light from the illumination light source;

based on the illuminance thus measured, resolving a change between an actual light exposure and a desired light exposure into a first component due to positional deviation of the optic axis of said illumination light occurring depending upon a position of each of said plural shot areas and a second component due to output change of said exposure light source itself; and correcting the light exposure for each of said plural shot areas according to said correction data based on said first component.

12. A light exposure controlling method according to claim 11, wherein when said first component exceeds a predetermined permissible amount, the optic axis of said illumination light is corrected, thereby performing correction of light exposure.

13. A light exposure controlling method according to claim 9, wherein said exposure apparatus is a scanning projection exposure apparatus for projecting onto each shot area on the substrate by synchronously scanning said mask and said substrate relative to said illumination light.

14. An exposure method for projecting a pattern formed on a mask to each of plural shot areas provided on a substrate with light through a projection system, said exposure method comprising the steps of:

detecting variations in energy of exposure beam at image plane side of said projection system which are caused by moving of movable members in said projection system; and controlling an exposure operation for each of said shot areas based on the detected variations.

15. An exposure method according to claim 14, wherein said controlling step includes a light exposure controlling for said substrate.

16. An exposure method according to claim 15, wherein said light exposure controlling is carried out for each of said shot areas.

17. An exposure method according to claim 14, wherein said variations in energy are caused by positional deviation of the optic axis of said exposure beam.

18. An exposure method according to claim 14, wherein at least one of said movable members is a movable stage on which said substrate is mounted.

19. An exposure method according to claim 15, further comprising the step of:

obtaining a light exposure correction data for each of said plural shot areas based on the detecting result of said detecting step so as to achieve an appropriate light exposure for each of said plural shot areas.

20. An exposure method for projecting a pattern formed on a mask to each of plural shot areas provided on a substrate with exposure beam through a projection system, the exposure method comprising the steps of:

detecting variations in energy of said exposure beam at image plane side of said projection system which are caused as said substrate moves in correspondence with a position of said substrate with respect to said projection system; and controlling an exposure operation for each of said shot areas based on the detected variations.

21. An exposure method for projecting a pattern formed on a mask to a substrate with illuminating said mask by exposure beam irradiated from a illumination system, the exposure method comprising the steps of:

detecting energy of said exposure beam at a first position in said illumination system;

detecting energy of said exposure beam at a second position different from said first position in said illumination system; and obtaining variations in energy of said exposure beam while passing on from said first position to said second position.

22. An exposure method according to claim 21, wherein said first position is located in a light source which emits said exposure beam.

23. An exposure method according to claim 21, wherein said exposure method further comprising a step of correcting a lighting characteristic of said illumination system according to said variations in energy.

24. An exposure method according to claim 21, wherein said variations in energy are responsive to positional deviation of an optic axis of said exposure beam.

25. An exposure method according to claim 24, wherein said exposure method further comprising a step of correcting a lighting characteristic of said illumination system according to said positional deviation.

* * * * *

UNITED STATES PATENT AND TRADEMARK OFFICE
CERTIFICATE OF CORRECTION

PATENT NO.    : 6,124,064
DATED         : September 26, 2000
INVENTOR(S)   : Ken Ozawa Page 1 of 1

It is certified that error appears in the above-identified patent and that said Letters Patent is hereby corrected as shown below:

Title page,
Item [30], Foreign Application Priority Data should read;
-- Feb. 14, 1997 [JP] Japan 9-030645 --

Signed and Sealed this

Seventh Day of May, 2002

Attest:

JAMES E. ROGAN
Director of the United States Patent and Trademark Office

Attesting Officer